United States Patent [19]

Nemeth-Johannes et al.

[11] Patent Number: 5,086,504

[45] Date of Patent: Feb. 4, 1992

[54] METHOD FOR PERFORMING COMPUTER SYSTEM FUNCTIONS DEFINED BY A HIERARCHIAL PROGRAMMING LANGUAGE HAVING DEFAULT NODES

[75] Inventors: Jay J. Nemeth-Johannes; Stephen J. Greer, both of Loveland, Colo.

[73] Assignee: Hewlett-Packard Co., Palo Alto, Calif.

[21] Appl. No.: 316,759

[22] Filed: Feb. 28, 1989

[51] Int. Cl.[5] .................... G06F 15/46; G06F 12/08; G06F 12/12; G06F 11/30

[52] U.S. Cl. .................... 395/700; 364/221.7; 364/221.9; 364/222; 364/251.6; 364/266; 364/267; 364/267.4; 364/269.4; 364/282.1; 364/282.3; 364/283.2; 364/283.3; 364/283.4; 364/DIG. 1

[58] Field of Search ... 364/200 MS File, 900 MS File

[56] References Cited

U.S. PATENT DOCUMENTS 4,471,459 9/1984 Dickinson et al. .................. 364/900

Primary Examiner—Thomas C. Lee
Assistant Examiner—Daniel Pan

[57] ABSTRACT

A method of extending a hierarchial programming language that retains compatibility with programs written for the original language. This method also allows a language to be defined that permits common commands to be abbreviated into shorter forms, providing a more user friendly system, while still permitting the longer form of a command to perform the intended way. The method also allows such a language to be restructured and extended by inserting a new level into the parse tree of the language. The method comprises inserting a default node into the parse tree of the language at the point where the extension, or the shortened command form, occurs. When the disclosed language parser method interprets the tree, the default node will be treated as if the mnemonic of the default node were actually in the command being parsed at the position where the default node appears in the tree. The disclosed method of processing the new parse tree also allows multiple commands per line, as required by existing standards. The method allows default nodes to occur at any level in the tree.

3 Claims, 8 Drawing Sheets

METHOD FOR PERFORMING COMPUTER SYSTEM FUNCTIONS DEFINED BY A HIERARCHIAL PROGRAMMING LANGUAGE HAVING DEFAULT NODES

BACKGROUND OF THE INVENTION

This invention relates to electronic test and measurement instruments and more particularly to such instruments which are programmable. Even more particularly, this invention relates to a method for extending a programming language used in such instruments.

Electronic test and measurement instruments are becoming more sophisticated each year. Many can now be programmed to produce a sequence of outputs or measurements, and most of these programmable instruments can be connected to other instruments through an electrical interface that allows the instrument to be programmed remotely. One of the most common of these interfaces is defined by the ANSI/IEEE Standard 488, which allows remote programming as well as transferring data from the instrument to a controller for analysis.

The ANSI/IEEE Standard 488 consists of two standards—ANSI/IEEE Standard 488.1 which defines the electrical characteristics of the bus and the communication protocols necessary to effect data exchange; and ANSI/IEEE Standard 488.2 which extends the 488.1 standard by defining standard message handling protocols, message syntax, common commands, status reporting structures and system configuration and synchronization protocols.

One of the provisions of the ANSI/IEEE 488.2 standard is the use of hierarchical languages in defining commands that are acceptable to the programmable instruments. The hierarchical language allowed by IEEE/ANSI 488.2 provides for a compound header that allows multiple mnemonics, separated by the colon (:) character. The description of this language may be specified by a parse tree, for example, the following parse tree represents a simple hierarchical language:

```
AAA
  :BBB
  :CCC
    :DDD
    :EEE
FFF
``` where a typical compound command header might be specified as AAA:CCC:DDD, where AAA, CCC, and DDD are mnemonics of the language. A complete instrument command consists of a header followed by zero or more parameters, where a parameter is typically a number. To be complete, a header must specify a mnemonic at each level of the parse tree. For example, AAA:CCC:EEE is complete, whereas AAA:CCC is incomplete, and therefore invalid.

A problem arises if the language needs to be extended by adding new commands, such as might occur with the release of a new version of an instrument, or with the introduction of a new instrument that will perform similar operations. A way is needed to provide an extension of the language which will not affect programs already written for the older version of the same language, so that the user of the new equipment will be able to continue to use existing software.

Adding a new command requires that a new node be inserted into the parse tree for the language. If the new node is added in parallel with an existing node, for example if a new node GGG were added to the above tree at the same level as AAA and FFF, little problem exists because existing programs will not have known about the node. However, if new nodes would extend the tree, for example if new nodes HHH and III were added below node FFF, existing programs will fail because they no longer specify a complete command. That is, FFF would no longer be a valid command since there is a level below FFF in the tree and the instrument would not know whether to perform the command FFF:HHH or FFF:III. Furthermore, there is no way to plan in advance for this occurrence, since all possible future enhancements would have to be known, and the user would have to enter many useless programming statements to allow for the future enhancements.

Another problem arises if the language needs to be restructured by adding a new level of a tree between existing levels. For example in the above tree, if a new level XXX needs to be added between the AAA level and the BBB, CCC level, the following tree would result:

```
AAA
  :XXX
    :BBB
    :CCC
      :DDD
      :EEE
FFF
``` which would not be compatible with existing software. Some commands in existing programs, written for the original language of the instrument, would not have a mnemonic at each level of the new tree, and therefore would be invalid commands.

Because all levels of a parse tree must be specified in a command, it becomes tedious for a user to enter frequently used commands in the instrument. The instrument would be much easier to use if these frequently used commands could be shortened, provided that no confusion is created with the shortening. While a completely new, shorter, command could be placed in the tree for this purpose, this would increase the total number of commands in the instrument thus increasing its overall complexity—a better solution would be to allow existing commands to be entered in a shortened form.

There is need in the art, then, for a method of extending a hierarchical programming language by extending existing commands while providing for compatibility with the existing software already written for the language. Another need in the art is for a method of extending a hierarchical language that allows adding a new level of commands. There is a further need for a method of interpreting a hierarchical programming language that allows frequently used commands to be entered using a shorter form that is more user friendly.

SUMMARY OF THE INVENTION

It is an object of the present invention to provide a method of extending a hierarchical programming language.

Another object of this invention is to provide a method of interpreting a hierarchical programming language where the most common commands can be defaulted to simpler commands.

Still another object of the present invention is to provide such a method that inserts a default node at any level in the parse tree of a hierarchical programming language.

It is a further object of the present invention to provide a method of walking a parse tree of a hierarchical programming language that incorporates a default node as contemplated by the present invention.

Another object of the present invention is to provide such an extension to a hierarchical programming language while allowing the correct interpretation of programs written for the original language.

A still further object of this invention is to provide a method of extending a hierarchical programming language that allows a parse tree to be restructured by adding a new level between existing levels.

The above and other objects of the present invention are accomplished by a method that comprises inserting a default node into the parse tree of the language at the point where the extension, or the shortened command form, occurs. The invention also comprises a language parser method that interprets the tree by treating the default node as if the mnemonic of the default node were actually in the command being parsed at the position where the default node appears in the tree. The method allows multiple commands per line, as required by existing standards, and it allows default nodes to occur at any level in the tree.

Once a default node has been inserted into the tree, the present invention allows new nodes that parallel the default node to be easily inserted. The default node and the new parallel nodes combine to restructure the tree by adding a new level to the tree without affecting software written for the original language.

Default nodes are inserted into the tree by finding the node to be split, connecting the default node to this split node in place of the split node's children or action routines, and then connecting the original children or action routines to the default node. The method also inserts a bypass node in parallel with the default node to facilitate parsing of the tree. New nodes may then be inserted in parallel with the default node as additional children.

When walking the tree, the method skips over default nodes if the command being parsed does not contain the default node, so that programs written for the original language are correctly interpreted. The method also processes multiple commands on a single line and retains the correct tree level to allow interpretation of incomplete mnemonic lists in subsequent commands on that line.

BRIEF DESCRIPTION OF THE DRAWINGS

The above and other objects, features, and advantages of the invention will be better understood by reading the following description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

The present invention is a method of extending a hierarchical programming language that allows programs written in the original language to still perform the same actions they performed before the extension was incorporated into the language. It also allows a language to be defined that permits common commands to be abbreviated into shorter forms, providing a more user friendly system, while still permitting the longer form of a command to perform the intended way.

The method used is to place a default node into the parse tree of the language at the point where the extension, or the shortened command form, will be incorporated. When the language parser interprets the tree, the default node will be treated as if the mnemonic of the default node were actually in the command being parsed at the position where the default node appears in the tree. The method allows default nodes to occur at any location in the tree.

Figure 1:
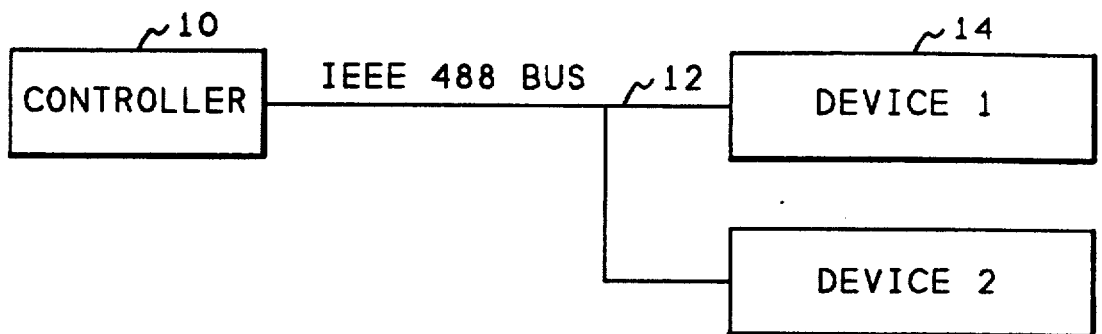
FIG. 1 is a diagram of a measurement system depicting the environment of the present invention.

FIG. 1 shows an instrument system such as would use the present invention. A controller 10 sends programming commands across the IEEE 488 Bus 12 to devices 14 and 16. The devices 14 and 16 are programmable instruments that incorporate the method of the present invention. For example, the controller 10 could be a computer, the device 14 could be a signal generator, and the device 16 could be a signal measuring device. If a filter is connected between device 14 and device 16, the computer 10 could program the devices 14 and 16 to measure the output of the filter over a range of frequencies.

Figure 2:
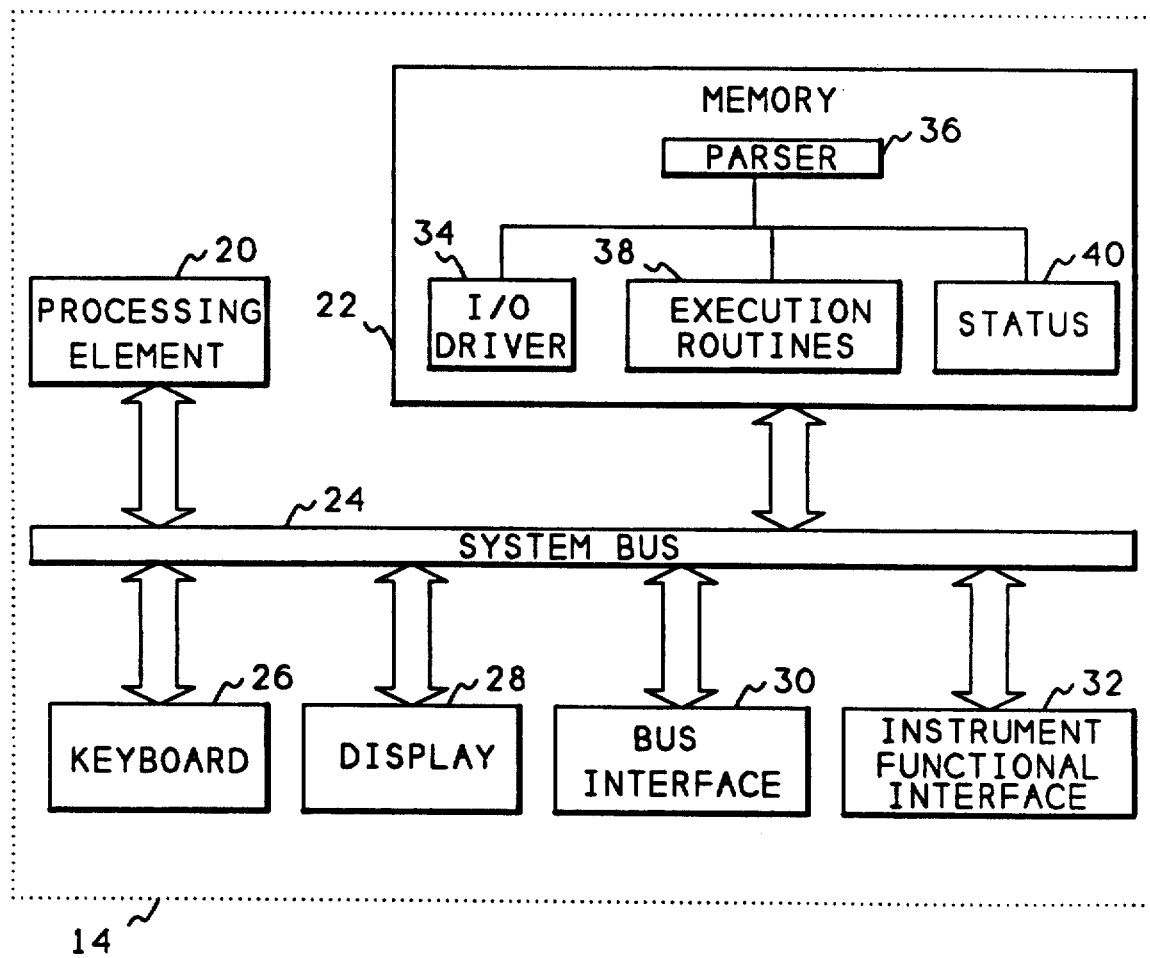
FIG. 2 shows a block diagram of an instrument wherein the present invention is used.

FIG. 2 shows a block diagram of the programmable instrument 14 (FIG. 1) that incorporates the present invention. A processing element 20 receives instructions from a memory 22 over a system bus 24. These instructions cause command sequences to be input from the user of the instrument through the Bus interface 30 and through the keyboard 26. Since user command sequences can come from the keyboard 26 or the Bus interface 30, only one of these two input devices is required in an instrument. Bus Interface 30 could connect to any interface capable of transmitting and receiving data, including the IEEE 488 bus. Data is output to the user through the display 28 and through the Bus interface 30. Again, only one of these two output devices is necessary.

User commands input by the device are received by the I/0 driver software 34 and passed to the parser 36 for interpretation. The parser 36 interprets the user commands and calls the execution routines 38 to direct the functions of the instrument through the instrument functional interface 32. (Throughout the description of this invention, the phrases execution routine(s) and action routine(s) are used interchangeably.) The parser also calls the status routine 40 to collect and display or transmit information requested by the user.

Figure 3:
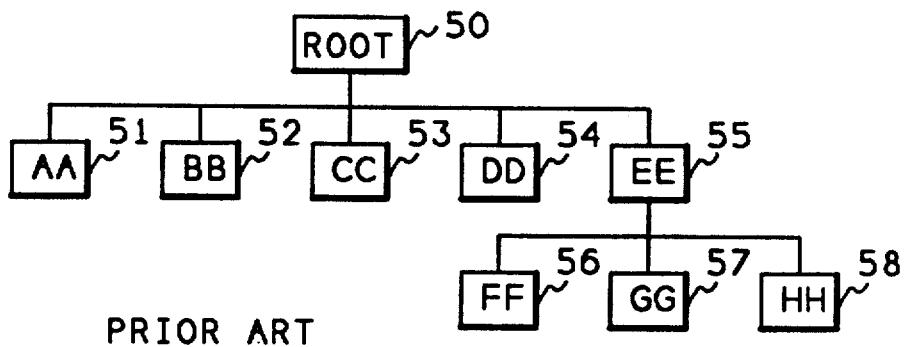
FIG. 3 shows a parse tree of a language for a measurement instrument.

FIG. 3 is a graphical representation of a parse tree for a prior art hierarchical programming language. The language has a root node 50 with five first level nodes AA 51, BB 52, CC 53, DD 54, and EE 55 below the root node 50. There are three nodes, FF 56, GG 57, and HH 58, located below node EE 55. A common way to express a command in such language is to separate the node mnemonics by a colon (:). Thus EE:FF would be a valid command of the above described language, as would AA, or BB (no colon is required since AA and BB are at the first level of the parse tree). In a parse tree, nodes located below a node and connected by a line are referred to as children. Thus node FF 56 is a child of node EE 55.

Figure 4:
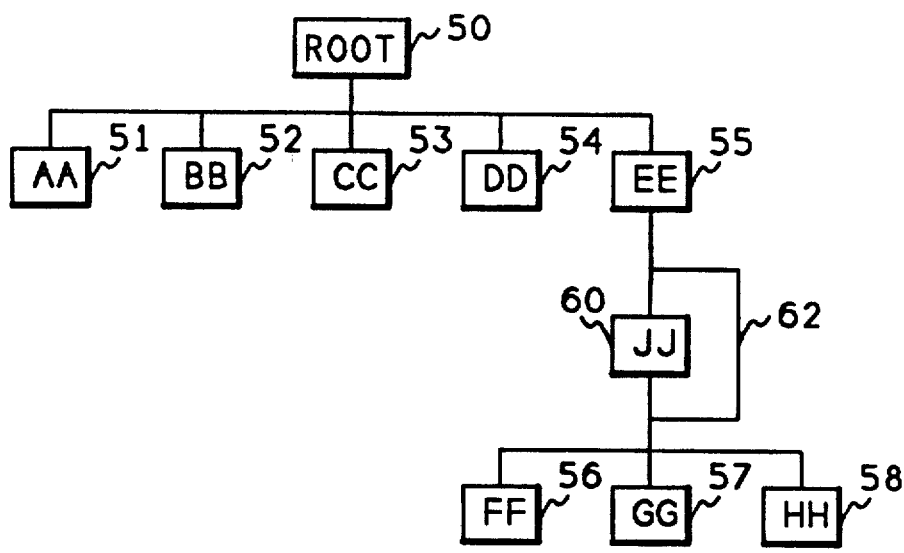
FIG. 4 shows the parse tree of FIG. 3 with a default node JJ incorporated therein.

FIG. 4 shows a parse tree of the language of FIG. 3, with a default node JJ 60 inserted between the node EE 55 and its children, FF 56, GG 57, and HH 58. A line 62 around the node JJ 60 indicates that the node JJ 60 is a default node in the parse tree. Because JJ 60 is a default node, a user command is not required to include its mnemonic. Thus, the command sequences EE:FF and EE:JJ:FF are equivalent, and would cause the instrument to perform the same action. Because these two commands are equivalent, a user program written using the prior art language of FIG. 3 would perform correctly on an instrument which has been extended by the present invention to an instrument having a language defined by the parse tree of FIG. 4. A parser using the parse tree of FIG. 4 could be placed in a new instrument, which previously used the language of FIG. 3, without affecting the actions caused by existing user programs. In this manner, the node JJ 60 has extended the language described by FIG. 3 without impacting existing software.

Figure 5:
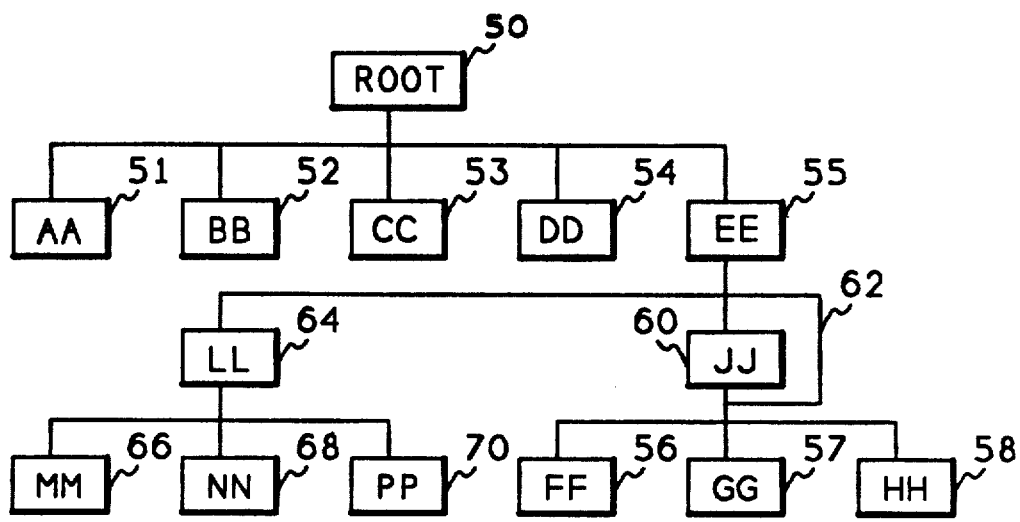
FIG. 5 shows the tree of FIG. 4 with an additional node LL in parallel with the default node.

Once a default node has been inserted into the tree, new nodes that parallel the default node can easily be added. FIG. 5 shows an extension to the language of FIG. 4 with a new node LL 64 (a sibling node) added in parallel with node JJ 62. Node LL 64 ha three children MM 66, NN 68 and PP 70. In this tree, because node JJ 60 is a default node, the command sequence EE:GG still produces the same action as in the prior art tree of FIG. 3. With the tree of FIG. 5, a whole new set of commands, for example EE:LL:PP, are allowed that will not impact existing programs.

Figure 6:
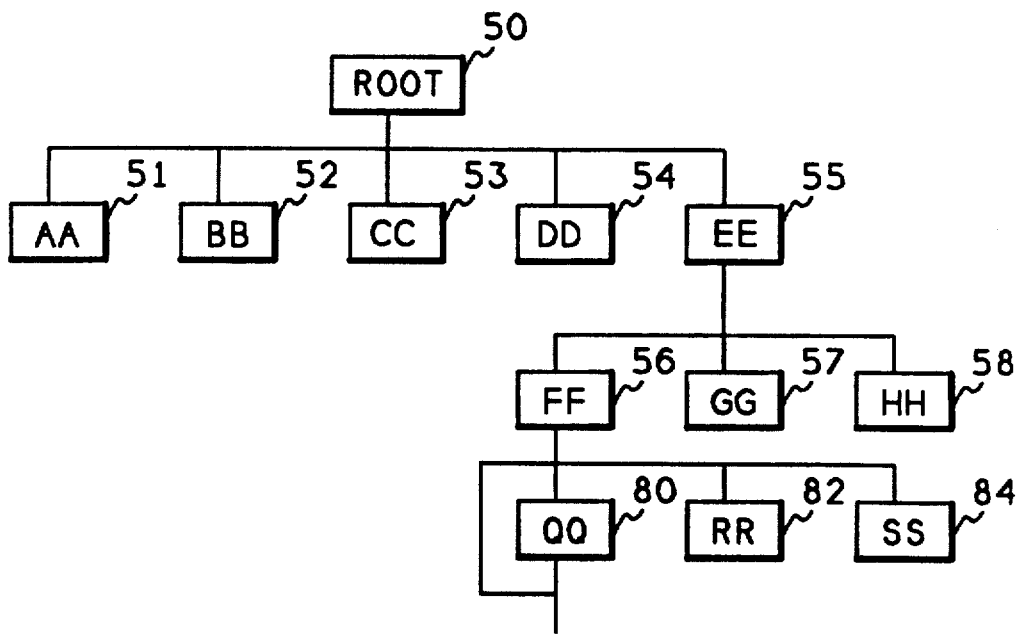
FIG. 6 shows the tree of FIG. 3 with a default node inserted below a leaf of the original tree.

One of the options allowed by the ANSI/IEEE Standard 488.2 is the use of multiple commands (each is called a <program message unit> in the standard) within a line of programming information (called a <program message> in the standard). Each command must be separated from the previous command by a semi-colon (;), and commands subsequent to the first need not repeat levels of the tree if the last mnemonic in the subsequent command would be a sibling of the last mnemonic in the previous command. Thus in the language of the tree of FIG. 3, the line EE:FF;GG is equivalent to the line EE:FF followed by the line EE:GG. The use of default nodes allows a new level to be added as a leaf (that is, a lowest level node) to a tree while preserving a sibling relationship among the new nodes added. FIG. 6 illustrates the addition of a new leaf default node QQ 80 below the node FF 56, and the addition of nodes RR 82 and SS 84 as siblings of the node QQ 80. Because node QQ 80 is a default node, compatibility with the tree of FIG. 3 is preserved, thus the command sequence EE:FF still produces the same action in the languages represented by both trees. Also, nodes GG 57 and HH 58 are still siblings of the node FF 56 so the line EE:FF;GG is still syntactically valid. Sending EE:FF:QQ allows the nodes RR 82 and SS 84 to be siblings, thus allowing the line EE:FF:QQ;RR to be syntactically valid.

Another advantage of having a default node as a leaf in a parse tree, such as node QQ 80 of FIG. 6, is to allow the user to enter a shorter set of command mnemonics for a command. By making the most common mnemonics of a command default nodes, these mnemonics need not be entered by the user, although they may be entered if the user desires. For example in the language of the parse tree of FIG. 6, the user can cause the action of the command EE:FF:QQ by entering the shorter command EE:FF, since QQ 80 is a default node. When designing a language, the most often used mnemonics of a command would be made default nodes, so that the user can save time by entering the command mnemonics without the default mnemonics. However, not every command can be shortened in this way since only one default node is possible at a given level of a parse tree. Since a default node is allowable at each level of a parse tree, some commands can be shortened by defaulting more than one mnemonic. In this manner, default nodes allow a language to be more user friendly when initially designed, as well as allowing the language to be extended later.

Figure 7:
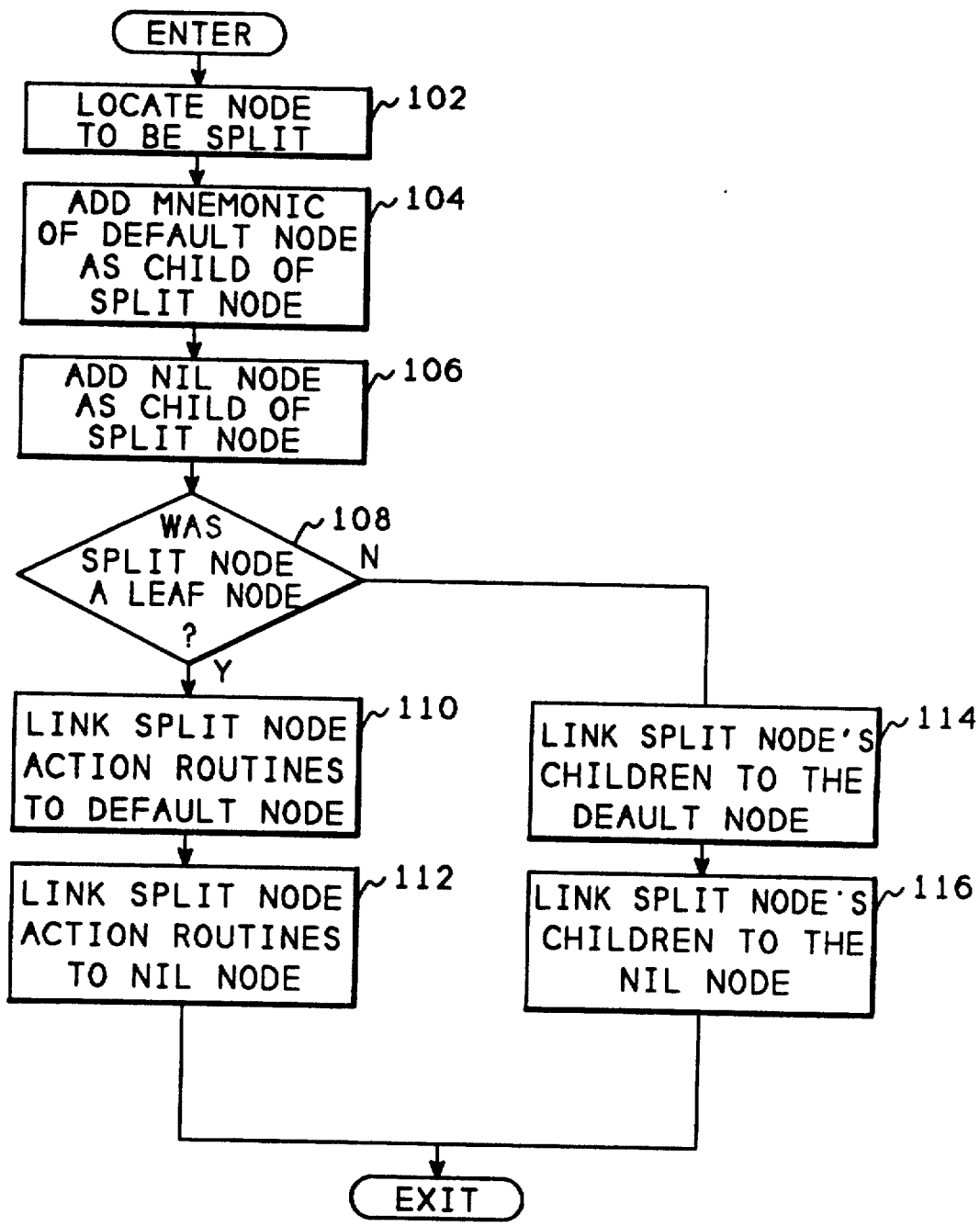
FIG. 7 is a flowchart depicting the method of inserting a default node into a parse tree.

Referring now to FIG. 7, a flowchart for inserting a default node into a parse tree is shown. Block 102 walks the parse tree to locate the node to be split, that is, the node below which the default node will be inserted. Walking the parse tree means that the software processes the data structure that defines the tree, starting at the root node of the tree and following pointers within the tree to locate the desired node. Data structures for storing trees and methods for processing these data structures are well known in the art. After locating the node to be split (the "split node"), block 104 inserts the new default node in the data structure for the tree, and then it connects the default node as a child of the split node. Block 106 creates a new node, called a bypass node, somewhere in the data structure for the tree, and connects the bypass node as a child of the split node. The bypass node defines a bypass for the default node, so that the tree walking method knows about the default node. This bypass is represented schematically by the line 62 of FIG. 4. The split node is the parent of the inserted default node, for example, node EE 55 of FIG. 4.

Once the default and bypass nodes have been inserted, block 108 determines whether the split node was a leaf node. If the split node was a leaf, it was originally connected to one or more action routines, so control transfers to block 110 where these action routines are connected to the default node. Block 112 then connects the action routines to the bypass node, so they can be found through both the default and bypass nodes, and control then flows to the exit.

If the split node was not a leaf, it was originally connected to one or more children, so control from block 108 transfers to block 114 where these children ar connected to the default node. Block 116 then connects these children to the bypass node, and control flows to the exit.

With completion of the flowchart of FIG. 7, a new default node has been inserted into the parse tree between the split node and its original children, or between the split node and its original action routines, depending upon where the split node was originally located in the tree.

Figure 8:
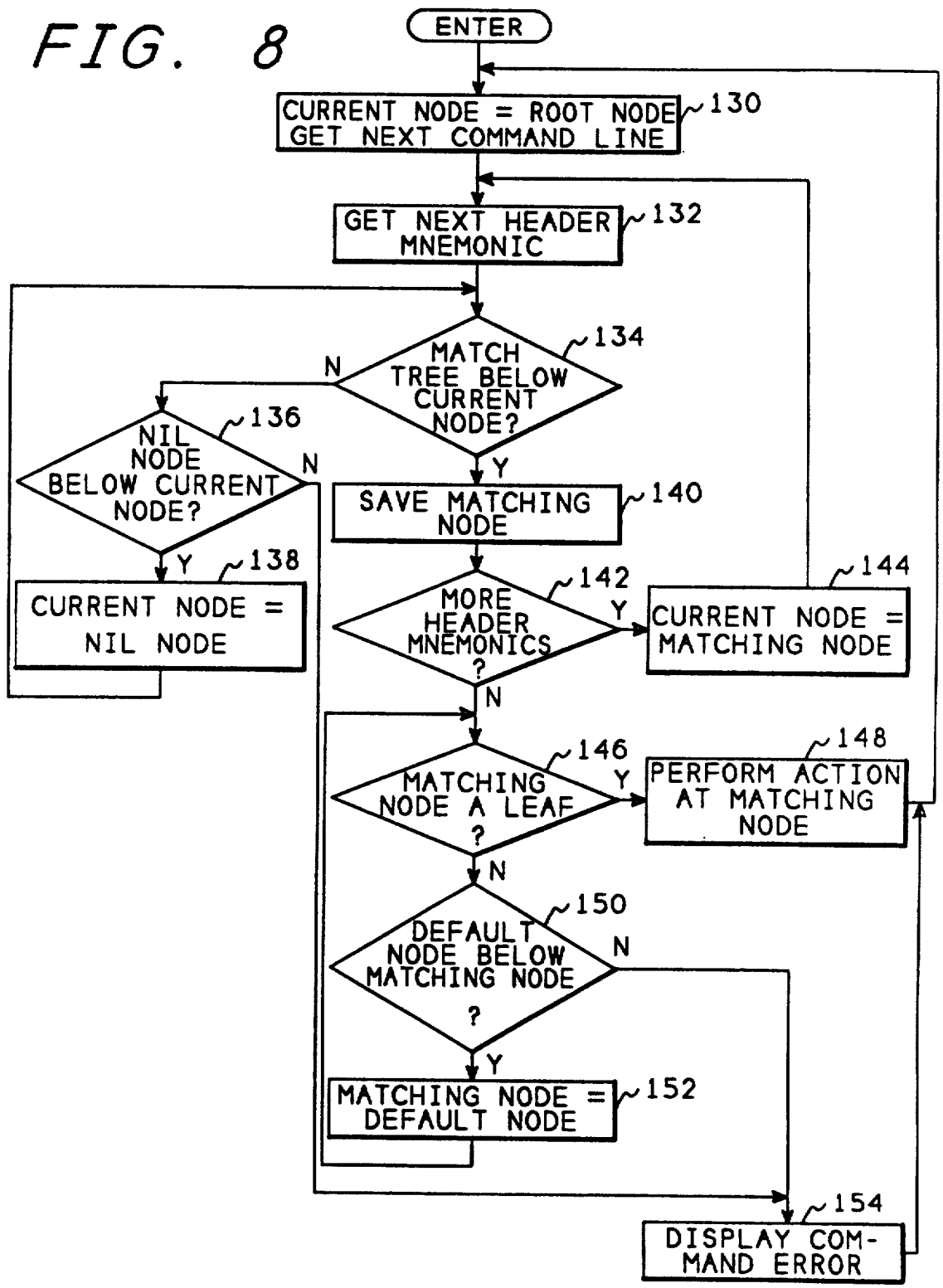
FIG. 8 is a flowchart showing a method of walking a parse tree for a system that allows only a single command per line.

FIG. 8 shows a method of walking a parse tree for a single command. After entering the flowchart, block 130 sets a current node indicator to the root node of the parse tree being walked and gets the next command to be processed. If no command is available, this block will wait until one is available. The current node indicator would typically be a pointer to a node, or an index of the node, depending upon the particular programming language in which the method is implemented. Block 13 then gets the next mnemonic from the header of the command being processed, and block 134 compares this header mnemonic to the mnemonics of all nodes below the current node in the tree. If no match is found, control transfers to block 136 where the nodes below the current node are checked for a bypass node. If a bypass node is found, control transfers to block 138 where the current node is replaced by the bypass node, and then control returns to block 134 to check a new level of the tree. If a bypass node was not found by block 136, control transfers to block 154 where a command error is returned to the user, either by being displayed on the instrument, or being sent back over the IEEE/ANSI 488 bus, or both.

If block 134 finds a matching mnemonic, the tree walking continues at block 140 which saves the matching node for future use. Block 142 then determines if there are more header mnemonics to be processed, and if there are, it transfers to block 144 where the current node is replaced by the matching node. Control then transfers back to block 132 to process the next header mnemonic.

If there are no more header mnemonics to process, block 142 transfers control to block 146, where the matching node is examined. If the matching node is a leaf, control transfers to block 148 to perform the action or actions defined at the leaf node, typically some instrument function, and then control returns to block 130 to process the next command. If the matching node is not a leaf node, control transfers to block 150 to determine if there is a default node as a child of the matching node. If there is not a default node below the matching node, control transfers to block 154 to report a command error, otherwise control transfers to block 152 where the default node is made the matching node. Control then returns to block 146 to check the new level.

The following is an example that follows the flowchart of FIG. 8 walking the parse tree of FIG. 4 to process the command EE:FF. Block 130 sets the current node to the root node 50, and gets the command EE:FF. Block 132 gets the next header mnemonic from the command, which is the mnemonic EE. Block 134 compares the header mnemonic EE to the mnemonics of the nodes below the current node (the ROOT node), and determines that node EE matches the header mnemonic EE, so it transfers to block 140 where node EE is saved as the matching node. Block 142 then determines there are more header mnemonics to process (i.e. FF remains), so control transfers to block 144 where node EE is made the current node. Block 132 then retrieves the next header mnemonic, FF. Block 134 examines the tree below the current node EE and does not find a match, so control transfers to block 136. Block 136 determines that the bypass node 62 is below the current node EE, so control transfers to block 138 where node 62 is made the current node. Block 134 is then entered and the nodes below node 62 are checked for a match with the header mnemonic FF. Node FF matches the mnemonic FF, so block 140 saves it as the matching node. Block 142 then determines that no more header mnemonics remain, so it transfers control to block 146. Since node FF is a leaf node, block 146 transfers to block 148 where the action defined by node 56 is performed before transferring back to block 130 to process the next command.

Figure 9:
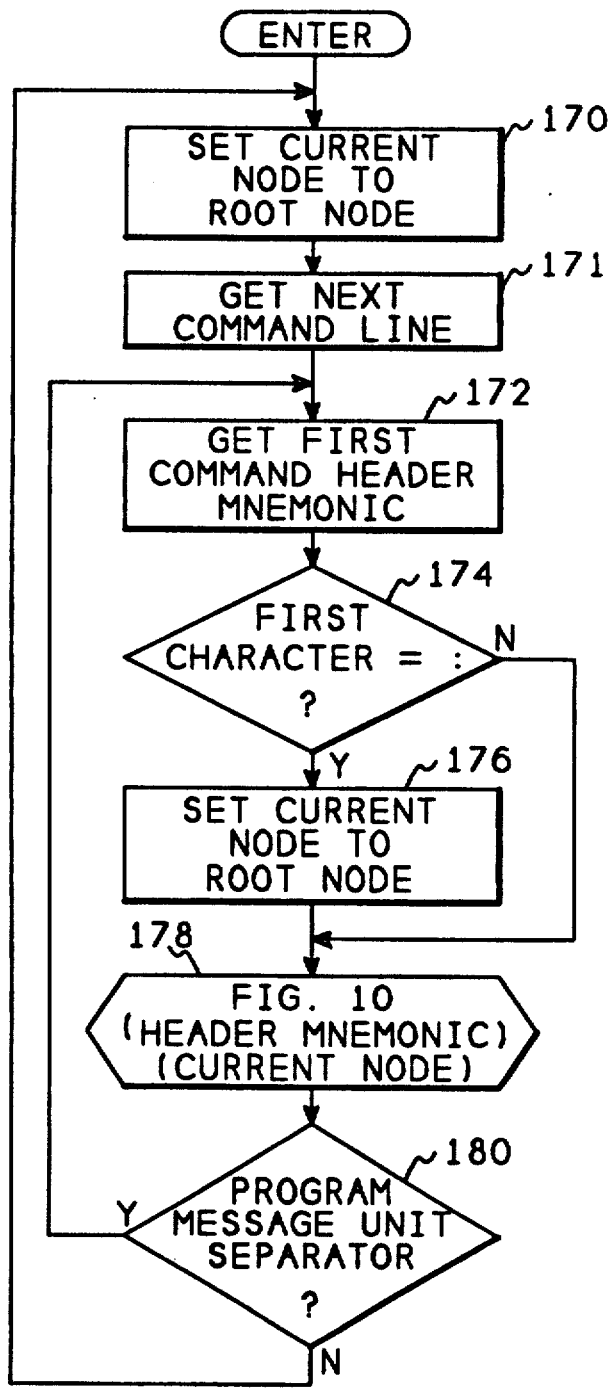
FIGS. 9 and 10 are flowcharts that show a method of walking a parse tree for a system that allows multiple commands per line.
Figure 10:
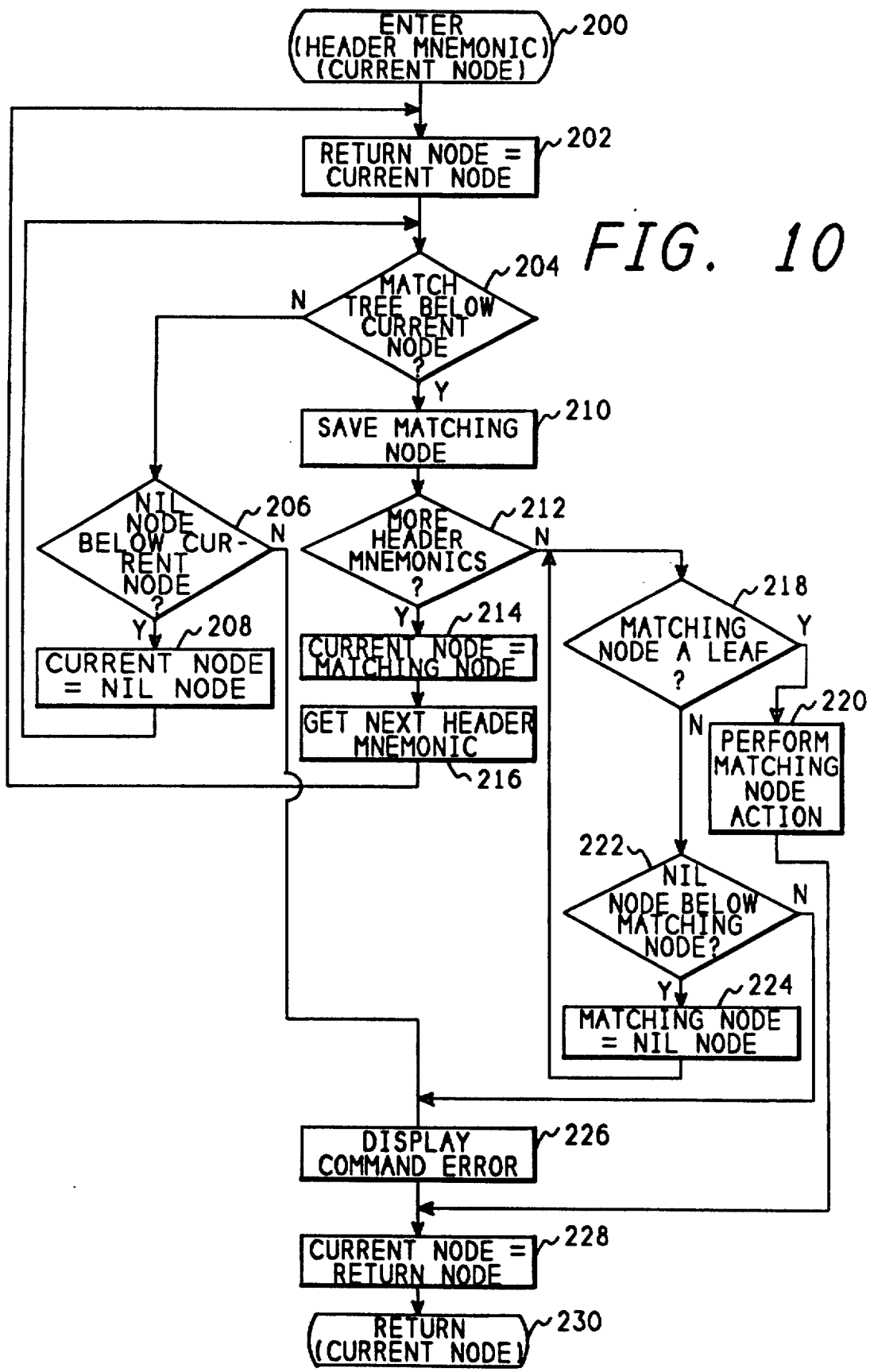

FIGS. 9 and 10 depict the processing of multiple commands within a single program message, typically a single line. A single program message can have multiple commands, each separated by a program message unit separator, which is a semicolon (;). As described earlier with reference to FIG. 6, the entire sequence of header mnemonics need not be repeated in each command. Subsequent commands within a line may not have the complete sequence of mnemonics from the root to the leaf, so the last level of the tree processed in a command is saved for use by the next command. Processing of the next command will start with the last position in the tree unless the first mnemonic of the command starts with a colon. FIG. 9 starts the processing of each command by determining where in the parse tree processing should start, while FIG. 10 completes the processing of the command by processing the tree starting at the point defined in FIG. 9. IEEE/ANSI 488.2 is followed in FIG. 9, whereas the portion of the processing shown in FIG. 10 handles default nodes in accordance with the present invention.

Referring now to FIG. 9, upon entering the flowchart, block 170 sets the current node to the root node of the tree. The root node is the initial position of the current node, and its position after the end of each line. Block 171 gets the next command line, which may contain several commands. If no command is available, this block waits until one is entered. Block 172 gets the first header mnemonic from the next command of the command line, and block 174 checks this mnemonic to determine if it starts with a colon character. If the first header mnemonic of a command starts with a colon, IEEE/ANSI 488.2 defines that the processing of the parse tree for that command must start at the root node. Therefore, if block 174 finds that the header mnemonic starts with a colon, control transfers to block 176 where the current node is set to the root node. If the header mnemonic does not start with a colon, or after setting the current node to the root node, control transfers to block 178 where FIG. 10 is called to process the rest of the command. After the command is processed, control returns to block 180 where the character ending the command is checked and if it is a program message unit separator (a semicolon), control transfers to block 172 to process the next command with the current node at its present location, otherwise control transfers to block 170 to reset the current node to the root node.

When block 178 calls FIG. 10, it passes the values of the header mnemonic and the current node to FIG. 10. These are received by the entry block 200 in FIG. 10. Referring now to FIG. 10, block 202 saves the value of the current node in return node. Block 204 then compares the header mnemonic to the mnemonics of all the nodes below the current node, and if no match is found, transfers control to block 206 where the nodes below the current node are checked to determine if any are a bypass node. If block 206 finds a bypass node, control transfers to block 208 where the current node is set to the bypass node, and processing continues with block 204 to check the next level of the tree. If block 206 does not find a bypass node, control transfers to block 226 to report a command error. After reporting a command error, the current node is set to the return node by block 228 before control returns to FIG. 9 at block 230.

If block 204 finds a match to the header mnemonic, it transfers to block 210 where the node matching the header mnemonic is saved as the matching node. If there are more header mnemonics, block 212 transfers to block 214 where the current node is set to the matching node. Block 216 then gets the next header mnemonic from the command before transferring to block 204 to process the next tree level.

If there are no more header mnemonics to process, block 212 transfers to block 218 where the matching node is examined. If the matching node is a leaf node, control transfers to block 220 to perform the action defined by the matching node, and then block 228 sets the current node to the return node before block 23 returns control to FIG. 9.

If block 218 finds that the matching node is not a leaf node, control transfers to block 222. Block 222 checks the tree level below the matching node and if it finds a bypass node, it transfers to block 224 where the matching node is set to the bypass node before control is transferred to block 218 to check the next level of the tree. If block 222 does not find a bypass node below the matching node, it transfers to block 226 to report a command error before returning to FIG. 9.

The following description will follow the processing of the command line EE:FF;LL:MM through FIGS. 9 and 10 using the parse tree of FIG. 5. Control enters FIG. 9 and block 170 sets the current node to the root node 50. Block 171 gets the command line EE:FF;LL:MM, and block 172 gets the first header mnemonic, EE, from the first command of the command line. Block 174 determines that EE does not start with a colon, so control transfers to block 178 where FIG. 10 is called with header mnemonic set to EE and current node set to the root node 50.

Control enters FIG. 10 and block 202 sets the return node to the current node (the ROOT node). Block 204 then checks the mnemonics of the nodes below the ROOT node and determines that a match exists at node EE, so control transfers to block 210 where node EE is saved as the matching node. Block 212 then determines that more header mnemonics need to be processed, so control transfers to block 214 where the current node is set to node EE, the matching node. Block 216 gets the next header mnemonic, FF, and transfers to block 202 which sets the return node to the current node, node EE. Block 204 does not find a match between FF and the mnemonics below node EE, so control transfers to block 206 which determines that bypass node 62 is below node EE, so control transfers to block 208. Block 208 sets the current node to 62 (the bypass node) and block 204 finds that node FF, below the current node 62, matches the header mnemonic FF, so it transfers to block 210. Block 210 saves node FF as the matching node and, since the character after the header mnemonic FF is a semicolon, block 212 determines there are no more header mnemonics to process. Control then transfers to block 218, and since node FF is a leaf, control goes to block 230 to perform the action defined at node FF. Block 228 then sets the current node to node EE, which was saved in return node, and control returns to FIG. 9, block 178.

In FIG. 9, control goes to block 180, and since a program message unit separator (the semicolon) is found, control transfers to block 172. Block 172 gets the header mnemonic, LL, from the next command. Block 174 checks the first character of LL and since this character is not a colon, control transfers to block 178 to call FIG. 10 again.

When control enters FIG. 10 again, block 202 sets the return node to the current node, node EE. Block 204 then checks the mnemonics of the nodes below node EE and determines that node LL matches the header mnemonic LL, so control transfers to block 210 to set the matching node to node LL. Block 212 determines that more header mnemonics exist in this command, so control transfers to block 214 to set the current node to the matching node LL. Block 216 gets the next header mnemonic, MM, and transfers to block 202 where the return node is set to node LL. Block 204 finds that node MM, below node LL, matches the header mnemonic MM, so control goes to block 210 where the matching node is set to node MM. Block 212 finds there are no more header mnemonics, so control transfers to block 218, and since the matching node MM is a leaf, control goes to block 220 to perform the action defined at node MM. Block 228 then sets the current node to the return node LL, and block 230 returns to FIG. 9.

When FIG. 9 regains control, block 180 determines that the command is not terminated by a semicolon, so control transfers to block 170 where the current node is set to the root node 50. Block 171 then waits for the next command line.

Processing continues in this loop, processing each user supplied command line, until the user turns off the instrument.

Figure 11:
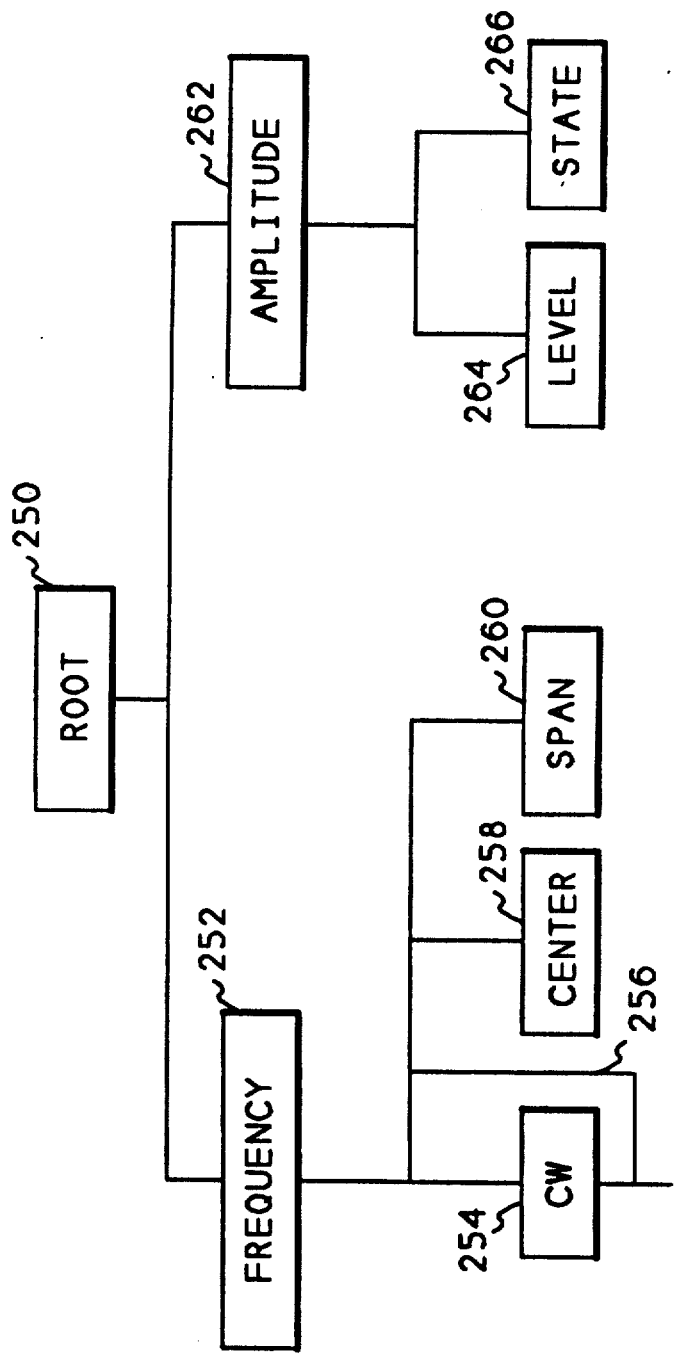
FIG. 11 is an example of a parse tree for an instrument language incorporating the present invention.

FIG. 11 shows an example of a parse tree for a simple signal generator. Under the root node 250, two commands for the instrument are shown. Node 252 is a command to set various aspects of FREQUENCY, and it has three children, CW 254, which is a default node having a bypass node 256 in parallel with it, CENTER 258, and SPAN 260. Also under the root node 250 is another series of commands to set the amplitude of the output signal. AMPLITUDE node 262 has two children LEVEL 264 and STATE 266. This parse tree can also be represented by the following:

| FREQUENCY | |
|---|---|
| [:CW] | <numeric value> |
| :CENTER | <numeric value> |
| :SPAN | <numeric value> |
| AMPLITUDE | |
| :LEVEL | <numeric value> |
| :STATE | <ON\|OFF> | where [ ] symbols enclose a default node, and the parameters of the commands are shown enclosed by < > symbols. This signal generator has the capability of outputting a single frequency, usually thought of as a continuous wave or CW, and it also has the capability of outputting a sweeping frequency. Since a single frequency output is more frequently used, the CW option is a default node so that both the commands FREQUENCY 1000 and FREQUENCY:CW 1000 would cause a 1000 hertz frequency to be output. The output frequency could be set to span between 800 and 1200 hertz by the command FREQUENCY:CENTER 1000;SPAN 400. The amount of signal to be output could be set with the command AMPLITUDE:-LEVEL 1. The output of the generator could be turned on and off by the commands AMPLITUDE:STATE ON or AMPLITUDE:STATE OFF.

If a frequency output of 2000 hertz is desired with a 2 volt output, the following command line would be entered:

FREQUENCY 2000;:AMPLITUDE:LEVEL 2;STATE ON

As an example, the following will trace the flowcharts of FIGS. 9 and 10 using the parse tree of FIG. 11 for the above command. After entering FIG. 9, block 170 sets the current node to the root node 250, and block 171 gets the above command line. Block 172 gets the first command mnemonic FREQUENCY from the first command of the line and block 174 finds that the mnemonic does not start with a colon, so it transfers to block 178 to call FIG. 10.

Upon entering FIG. 10, block 202 sets the return node to the ROOT node and block 204 matches the mnemonic FREQUENCY to node 252 of FIG. 11, so control goes to block 210 where FREQUENCY is saved as the matching node. Since there is a space after FREQUENCY in the command, block 212 finds there are no more mnemonics so it transfers to block 218 where the matching node FREQUENCY is checked to determine if it is a leaf. FREQUENCY node 252 is not a leaf, since there are nodes below it in the parse tree, so control transfers to block 222 to determine if there is a bypass node below FREQUENCY. Since the bypass node 256 is below FREQUENCY, block 222 transfers to block 224 which sets the matching node to the bypass node 256. Block 218 finds that the bypass node is a leaf so it transfers to block 220 to perform the action of setting the output frequency to the command parameter of 2000 hertz. Control then goes to block 228 where the current node is set to the ROOT node, and then block 230 returns to FIG. 9.

Upon reentering FIG. 9, block 180 finds a semicolon after the parameter 2000, so control goes to block 172 to get the next mnemonic. Block 172 gets the mnemonic AMPLITUDE from the command line and since this mnemonic starts with a colon, block 176 sets the current node to ROOT before block 178 calls FIG. 10 again.

FIG. 10 block 202 sets the return node to the ROOT node since this was passed as the current node. Block 204 matches the mnemonic AMPLITUDE to node 262 so block 210 sets AMPLITUDE as the matching node. Block 212 finds there are more header mnemonics, since the next character is a colon, and transfers to block 214 where AMPLITUDE is set into the current node. Block 216 then gets the mnemonic LEVEL from the command line, and block 202 sets the return node to the current node, AMPLITUDE. Block 204 finds a match at node 264 and goes to block 210 to set the matching node to LEVEL. Block 212 finds a space after the mnemonic LEVEL, indicating that there are no more mnemonics, so it transfers to block 218 where LEVEL is determined to be a leaf node, so block 220 performs the action routine connected to LEVEL which sets the signal generator output level to 2 volts. Block 228 then sets the current node to the return node of AMPLITUDE, and goes back to FIG. 9.

FIG. 9 block 180 finds a semicolon as the next character in the command line, so it transfers to block 172 to get the next mnemonic, which is STATE. Block 174 finds that the first character is not a colon, so it goes to block 178 to call FIG. 10.

FIG. 10 block 202 sets the return node to AMPLITUDE, the current node. Block 204 finds a match to the mnemonic STATE at node 266, so it transfers to block 210 to set the matching node to STATE. Block 212 finds a space after the mnemonic, which indicates no more mnemonics, so it transfers to block 218 which finds that STATE is a leaf node. Block 220 then performs the action routine connected to node 266 which turns the signal generator on. Block 228 sets the current node to the return node AMPLITUDE, and block 230 returns to FIG. 9.

FIG. 9 block 180 does not find a semicolon after the ON parameter at the end of the line, so it transfers to block 170 where the current node is set to the ROOT node, and block 172 waits for the next command from the user. Since no command has been input, block 171 will wait until a command line is input, or the instrument is powered off.

Having thus described a presented preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A computer implemented method of parsing a command in an extensible hierarchical programming language within a computer driven system, said language being defined by a parse tree having extension represented by default nodes, said computer implemented method comprising the steps of:

retrieving one or more header mnemonics of said command;

sequentially matching each of said header mnemonics retrieved to a mnemonic of a node of successive levels of said parse tree;

if no match occurs at one of said levels of said parse tree and said level has a default node, skipping said level;

matching any remaining default nodes below any node having a mnemonic that matches a last of said header mnemonics; and if said last header mnemonic matches a lowest level node of said parse tree, performing at least one computer system function, within said computer driven system, defined at said lowest level node.

2. A computer implemented method of parsing one or more commands of a command line in an extensible hierarchical programming language within a computer driven system, said language being defined by a parse tree having extension represented by default nodes, said computer implemented method comprising the steps of:

(a) setting a tree level to a highest level of said parse tree;

(b) retrieving a next command line;

(c) retrieving one or more header mnemonics of a next command of said command line;

(d) sequentially matching each of said header mnemonics retrieved to a mnemonic of a node of successive levels of said parse tree, starting at said tree level;

(e) if no match occurs at one of said levels of said parse tree and said level has a default node, skipping said level;

(f) retaining a previous matching tree level each time a match occurs;

(g) matching any remaining default nodes below any node having a mnemonic that matches a last of said header mnemonics;

(h) if said last header mnemonic matches a lowest level node of said parse tree, performing at least one computer system function, with said computer driven system, defined at said lowest level node;

(i) if more commands remain within said command line, setting said tree level to said previous matching tree level, and proceeding with step (c); and (j) proceeding with step (a).

3. A computer implemented method of parsing a series of commands in an extensible hierarchical programming language within a computer driven system, said language being defined by a parse tree having extensions represented by default nodes with parallel nil nodes, said computer implemented method comprising the steps of:

(a) setting a current node indicator to reference a root node of said parse tree;

(aa) retrieving a next one of said commands;

(b) getting a next header mnemonic from said command;

(c) if said header mnemonic does not match a mnemonic of a node below said current node in said parse tree, proceeding with step (j);

(d) saving a matching node indicator from a node below said current node in said parse tree wherein a mnemonic of said node matches said header mnemonic;

(e) if no more header mnemonics are available for said header, proceeding with step (g);

(f) setting said current node indicator to said matching node indicator, and proceeding with step (b);

(g) if said matching node indicator references a leaf node of said parse tree, proceeding with step (l);

(h) if a default node does not exist below said matching node in said parse tree, proceeding with stem (m);

(i) setting said matching node indicator to reference a default node below said matching node, and proceeding with step (g);

(j) if a nil node does not exist below said current node in said parse tree, proceeding with step (m);

(k) setting said current node indicator to reference a nil node below said current node, and proceeding with step (c);

(l) performing at least one computer system function, with in said computer driven system, required at said matching node of said parse tree, then proceeding with step (a);

(m) returning a command error, then proceeding with step (a).

* * * * *